(12) United States Patent
Kawamura et al.

(10) Patent No.: US 7,459,264 B2
(45) Date of Patent: Dec. 2, 2008

(54) DEVICE MANUFACTURING METHOD

(75) Inventors: Daisuke Kawamura, Yokohama (JP); Akiko Mimotogi, Yokohama (JP); Takashi Sato, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 536 days.

(21) Appl. No.: 11/175,275

(22) Filed: Jul. 7, 2005

(65) Prior Publication Data

US 2006/0008747 A1 Jan. 12, 2006

(30) Foreign Application Priority Data

Jul. 7, 2004 (JP) ............................. 2004-200610

(51) Int. Cl.
G03F 7/26 (2006.01)

(52) U.S. Cl. ...................... 430/311; 430/330

(58) Field of Classification Search .................. 430/311
See application file for complete search history.

(56) References Cited

U.S. PATENT DOCUMENTS

| 5,715,039 A | 2/1998 | Fukuda et al. |
| 5,900,354 A | 5/1999 | Batchelder |
| 2002/0163629 A1 | 11/2002 | Switkes et al. |
| 2004/0075895 A1 | 4/2004 | Lin |
| 2006/0028626 A1* | 2/2006 | Chang et al. .................. 355/30 |
| 2006/0132731 A1* | 6/2006 | Jansen et al. .................. 355/30 |
| 2007/0031755 A1* | 2/2007 | Hirayama et al. ......... 430/270.1 |

FOREIGN PATENT DOCUMENTS

| CN | 1751272 A | 3/2006 |
| JP | 10-303114 | 11/1998 |
| JP | 10-340846 | 12/1998 |
| JP | 2004-335820 | 11/2004 |
| JP | 2004-335821 | 11/2004 |
| JP | 2004-363588 | 12/2004 |
| JP | 2005-019433 | 1/2005 |
| JP | 2005-079140 | 3/2005 |
| JP | 2005-079238 | 3/2005 |
| TW | 554422 | 9/2003 |
| WO | WO 99/49504 | 9/1999 |

OTHER PUBLICATIONS

Smith et al., "Approaching the Numerical Aperture of Water-Immersion Lithography at 193nm", Proceedings of SPIE, vol. 5377, pp. 273-284, (2004).

Notification for Filing Opinion in Examination from Taiwanese Patent Office dated Apr. 27, 2007, in counterpart foreign Application No.094123062 and English Language Translation thereof.

Office Action from China Patent Office mailed Jul. 6, 2007, in counterpart foreign Application No. 2005/100826421 and English Language Translation thereof.

* cited by examiner

*Primary Examiner*—Kathleen Duda
(74) *Attorney, Agent, or Firm*—Finnegan, Henderson, Farabow, Garrett & Dunner, L.L.P.

(57) ABSTRACT

A device manufacturing method is disclosed, which includes forming a resist film on a substrate, preparing an exposure tool which comprises a projection optical system, preparing a photo mask on which a mask pattern is formed, mounting the substrate and the photo mask on the exposure tool, the substrate having the resist film formed thereon, transferring the mask pattern formed on the photo mask onto the resist film in a state in which a solution including an oxidative agent is filled between the resist film and a final element of a projection optical system to form a latent image of the mask pattern on the resist film, heating the resist film having the latent image formed thereon, and developing the heated resist film.

14 Claims, 1 Drawing Sheet

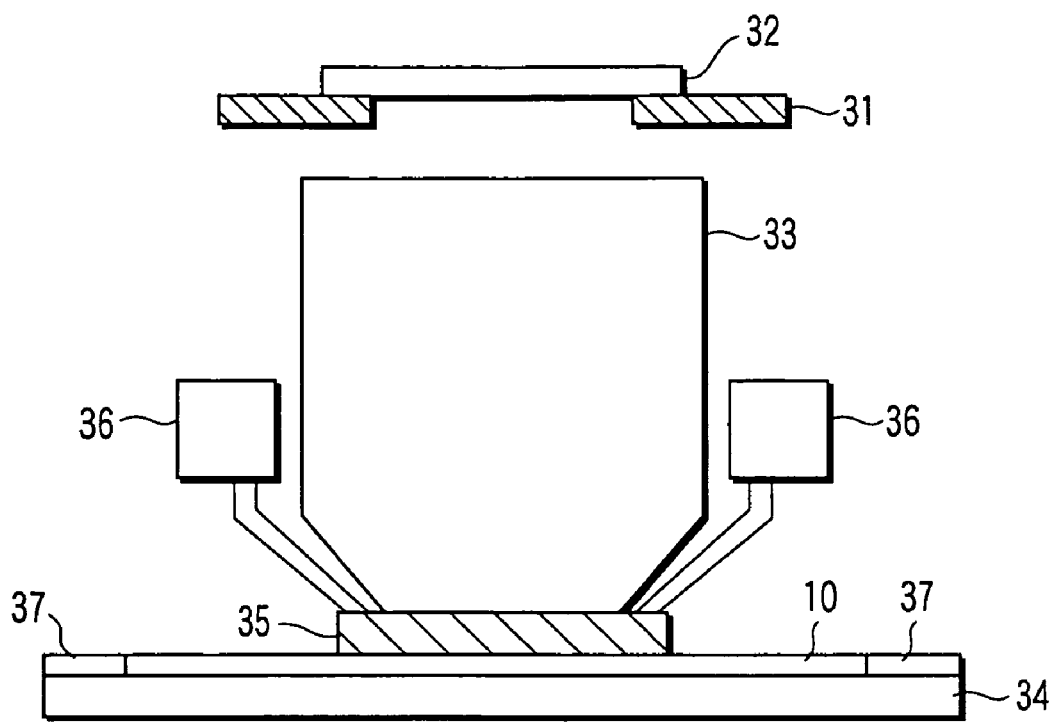
FIGURE

DEVICE MANUFACTURING METHOD

CROSS-REFERENCE TO RELATED APPLICATIONS

This application is based upon and claims the benefit of priority from prior Japanese Patent Application No. 2004-200610, filed Jul. 7, 2004, the entire contents of which are incorporated herein by reference.

BACKGROUND OF THE INVENTION

1. Field of the Invention

The present invention relates to a device manufacturing method including a process of transferring a pattern to a resist film by liquid immersion lithography.

2. Description of the Related Art

With a finer pattern on a semiconductor device, improvement of an exposure tool has been advanced. There is currently used a 193 nm lithography in which an ArF laser having a wavelength of 193 nm is used as a light source. Up to now, a 157 nm lithography has been expected as a next generation lithography. However, because of a variety of factors such as a delay of the development of equipments and materials for 157 nm lithography, and a short service life, at present, 193 nm immersion lithography becomes the most promising next generation lithography (WO 99/49504 or Bruce W. Smith et al., Optical Microlithography XVII, Proceedings of SPIE vol. 5377 (2004), pp. 273-284). In the liquid immersion lithography, a refractive index of a medium fluid filled in an optical path between the final element of projection optical system and substrate stacked resist films as an imaging plane (hereinafter, referred to as a "liquid immersion medium fluid") is large. By using a liquid immersion medium fluid with a large refractive index, a critical angle of an optical axis of the final element of projection optical system side is able to made large, so that projection of a diffractive light by a fine pattern which is smaller than a resolution limit of a ordinary exposure tool in which the medium fluid is air, becomes possible. In the liquid immersion exposure tool which is currently a mainstream of development, only an optical path between the final element of projection optical system and a substrate and a periphery of the optical path are filled by the liquid immersion medium fluid, instead of immersing a whole substrate surface in the liquid immersion medium fluid.

It is important that the liquid immersion medium fluid has a high transparency in exposure wavelength. In the 193 nm immersion lithography, ultra pure water having a refractive index of about 1.44 is expected as the most promising solvent. In the 157 nm immersion lithography, a test example in which a fluorine solution is used as the solvent has been reported. With an high refractive index of the liquid immersion medium fluid, it becomes possible to form a fine pattern by using a properly designed optical system.

In liquid immersion lithography, there is a concern that inconvenience in a resist process occurs due to a contact between the liquid immersion medium fluid and the resist film. Specific problems are exemplified as follows.

(1) With respect to many resist materials, a T-top shape occurs with a formed resist pattern, or defects after development increases.

(2) Decrease of uniformity occurs in the dimension or shape of the resist pattern within a wafer and/or within a shot.

(3) In the case where a liquid immersion medium fluid remains on a substrate after exposure, it can cause contamination and/or a breakdown of the exposure tool and/or the coating and developing device.

(4) In the case where bubbles occur in the optical path, it causes degradation of the optical image as a flare or aberration. Even if the liquid immersion medium fluid is degassed, relative movement of the liquid immersion medium fluid occurs on a step of a substrate or at an edge of the substrate, and an atmospheric gas in the exposure tool may be captured in the liquid immersion medium fluid.

In order to avoid a contact between the liquid immersion medium fluid and the resist film, it is examined that a cover material film is provided on the resist film. Even in the case where the cover material film has been provided, however, there is a possibility that all of the above-described problems occur, although their degrees are different from each other, in the case where the shield of the cover material film against the liquid immersion medium fluid is not sufficient; in the case where there occurs capturing of the resist film component dissolved by the solvent of the cover material into the cover material film; or in the case where there occurs deposition of particles onto a surface of the cover material film during coating and/or baking process. At least, there is a possibility that decrease of uniformity occurs in the dimension of the resist pattern within a wafer and/or within a shot.

BRIEF SUMMARY OF THE INVENTION

According to an aspect of the present invention, there is provided a device manufacturing method comprising:
forming a resist film on a substrate;
preparing an exposure tool which comprises a projection optical system;
preparing a photo mask on which a mask pattern is formed;
mounting the substrate and the photo mask on the exposure tool, the substrate having the resist film formed thereon;
transferring the mask pattern formed on the photo mask onto the resist film in a state in which the liquid immersion medium fluid including an oxidative substance is filled between the resist film and a final element of the projection optical system to form a latent image of the mask pattern in the resist film;
heating the resist film having the latent image formed thereon; and
developing the heated resist film.

According to another aspect of the present invention, there is provided a device manufacturing method comprising:
forming a resist film on a substrate;
forming a cover material film on the resist film;
preparing an exposure tool which comprises a projection optical system;
preparing a photo mask on which a mask pattern is formed;
mounting the substrate and the photo mask on the exposure tool, the substrate having the resist film formed thereon;
transferring the mask pattern formed on the photo mask onto the resist film in a state in which a buffer solution as liquid immersion medium fluid is filled between the cover material film and a final element of the projection optical system to form a latent image of the mask pattern on the resist film;
heating the resist film having the latent image formed thereon;
removing the cover material film after the heating of the resist film; and
developing the heated resist film.

According to a further aspect of the present invention, there is provided a device manufacturing method comprising:
forming a resist film on a substrate;
preparing an exposure tool which comprises a projection optical system;

preparing a photo mask on which a mask pattern is formed;

mounting the substrate and the photo mask on the exposure tool, the substrate having the resist film formed thereon;

transferring the mask pattern formed on the photo mask onto the resist film in a state in which a liquid immersion medium fluid including a surfactant and an acid or a liquid immersion medium fluid including a surfactant and an oxidative agent is filled between the resist film and a final element of the projection optical system to form a latent image of the mask pattern on the resist film;

heating the resist film having the latent image formed thereon; and developing the heated resist film.

According to a further aspect of the present invention, there is provided a device manufacturing method comprising:

forming a resist film on a substrate;

forming a cover material film on the resist film;

preparing an exposure tool which comprises a projection optical system;

preparing a photo mask on which a mask pattern has been formed;

mounting the substrate and the photo mask on the exposure tool, the substrate having the resist film formed thereon;

transferring the mask pattern formed on the photo mask onto the resist film in a state in which a solution including a solvent other than pure water and a predetermined additive is filled between the cover material film and a final element of the projection optical system to form a latent image of the mask pattern on the resist film;

heating the resist film having the latent image formed thereon;

removing the cover material film after the heating of the resist film; and developing the heated resist film.

According to a further aspect of the present invention, there is provided a device manufacturing method comprising:

forming a resist film on a substrate;

preparing an exposure tool which comprises a projection optical system;

preparing a photo mask on which a mask pattern is formed;

mounting the substrate and the photo mask on the exposure tool, the substrate having the resist film formed thereon;

transferring the mask pattern formed on the photo mask onto the resist film in a state in which a liquid immersion medium fluid including a solvent other than pure water and a predetermined additive is filled between the resist film and a final element of the projection optical system to form a latent image of the mask pattern on the resist film;

cleaning a surface of the resist film having the latent image formed thereon by using a cleaning solution;

heating the resist film; and developing the heated resist film.

According to a further aspect of the present invention, there is provided a device manufacturing method comprising:

forming a resist film on a substrate;

forming a cover material film on the resist film;

preparing an exposure tool which comprises a projection optical system;

preparing a photo mask on which a mask pattern is formed;

mounting on the exposure tool the substrate and the photo mask, the substrate having the resist film formed thereon;

transferring the mask pattern formed on the photo mask onto the resist film in a state in which a liquid immersion medium fluid including a solvent other than pure water and a predetermined additive is filled between the cover material film and a final element of the projection optical system to form a latent image of the mask pattern on the resist film;

cleaning a surface of the cover material film on the resist film having the latent image formed therein by using a cleaning solution;

heating the resist film;

removing the cover material film after the heating of the resist film; and developing the heated resist film.

According to a further aspect of the present invention, there is provided a device manufacturing method comprising:

forming a resist film on a substrate;

forming a cover material film on the resist film;

cleaning a surface of the cover material film by using a cleaning solution;

preparing an exposure tool which comprises a protection optical system;

preparing a photo mask on which a mask pattern has been formed;

mounting on the exposure tool the substrate and the photo mask, the substrate having the resist film formed thereon;

transferring the mask pattern formed on the photo mask onto the resist film in a state in which a solution is filled between the cover material film and a final element of the projection optical system to form a latent image of the mask pattern on the resist film;

heating the resist film having the latent image formed thereon;

removing the cover material film after the heating of the resist film;

developing the heated resist film.

BRIEF DESCRIPTION OF THE SEVERAL VIEWS OF THE DRAWING

The single FIGURE is a view showing a general configuration of a liquid immersion exposure tool according to embodiments of the present invention.

DETAILED DESCRIPTION OF THE INVENTION

Hereinafter, embodiments of the present invention will be described with reference to the accompanying drawings.

First Embodiment

For 157 nm resist materials, absorption of C—H bond is a problem. Thus, unlike a 193 nm resist mainly made of (meta) acrylate resin, a 248 nm resist mainly made of a polyhydroxystyrene derivative, and a conventional resist material for i-line and g-line mainly made of a novolac resin, use of a fluorine resin has been discussed for 157 nm resist materials. The 157 nm resist resin includes, for example, a copolymer resin of a TFT (tetrafluoro ethylene) and norbornene derivative.

As a liquid immersion medium fluid in the 157 nm liquid immersion, there has been discussed use of a fluorine solution (or fluorine oil) such as PFPE (prefluorinated polyethers), PFTG (perfluoro triglyime: $CF_3[OCF_2CF_2]_3OCF_3$), and IF24 (available from DuPont). (M. Switkes et al., J. Vac. Sci. Technol. B21 (6), pp. 2794-2799 (2003)).

Now, a description will be given with respect to an embodiment of a liquid immersion exposure tool in which a liquid immersion medium fluid other than pure water is used, while a cover material film is not used. An acid added liquid immersion medium fluid is used as the liquid immersion medium fluid.

A first anti-reflection film (bottom anti-reflection film) is formed on a substrate. The first anti-reflection film is made of a first mask material serving as a mask for processing a substrate. A second anti-reflection film (top anti-reflection film) is formed on the first anti-reflection film. The second anti-reflection film is made of a second mask material serving as a mask for processing the first anti-reflection film. A chemically amplified resist film is formed. The typical method of forming resist film is spin coating process. Baking is carried out after the coating of the resist film at a predetermined temperature and for a predetermined period of time to form a chemically amplified resist film. Next, the substrate is transported to a 157 nm liquid immersion exposure tool. In the liquid immersion exposure tool a photo mask for forming a semiconductor device pattern of a given layer is stored. The FIGURE shows a general configuration of the exposure tool according to a first embodiment of the present invention. A reticle stage 31 is disposed below an illumination optical system (not shown). A reticle 32 which is a photo mask is installed on the reticle stage 31. The reticle stage 31 can move in parallel. A projection lens system 33 is disposed below the reticle stage 31. A wafer stage 34 is disposed below the projection lens system 33. A semiconductor substrate 10 has undergone the above-described processing is placed on the wafer stage 34. The wafer stage 34 moves in parallel with the semiconductor substrate 10. A support plate 37 is provided at the periphery of the semiconductor substrate 10.

A fence 35 is mounted below the projection lens system 33. A pair of liquid immersion medium fluid supply and discharge devices 36 which supply the liquid immersion medium fluid into the fence 35 and discharge the liquid immersion medium fluid from the inside of the fence 35 are provided beside the projection lens system 33. Exposure is carried out in a state in which the liquid immersion medium fluid is filled between the substrate 10 and the last element of the projection optical system 33 in a region surrounded by the fence 35 and the projection lens 33. By carrying out an exposure, an image of a mask pattern (not shown) on the reticle 32 is projected, and a latent image is formed on the chemically amplified resist film on the substrate surface in the exposed region.

In the present embodiment, the fluid obtained by adding an acid having a predetermined concentration to a fluorine solution is used as a liquid immersion medium fluid filled between the last element of the projection optical system and the substrate. The fluorine solution is a pure solution which can be industrially produced, the solution being free of a dissolved substance including a gas.

A PEB (Post Exposure Bake) process is carried out for a predetermined period of time and at a predetermined temperature with respect to the substrate after the exposure process. Next, developing is carried out for a predetermined period of time by using a 2.38% TMAH developer. After the developing and rinse process has been carried out, a drying process is carried out. Although the rinse process after development is typically carried out by using pure water, a surfactant may be added. In addition, substitution by a polar solvent, substitution by a gas in supercritical fluid and the like may be carried out.

When an acid added liquid immersion medium fluid is used, the generation of the T-top shape of the resist pattern is reduced, and uniformity of dimension and shape of the resist pattern within a wafer and/or within a shot is improved as compared with the case of adding no acid. Further, reduction of defects after development of the resist can be expected.

The reduction of the T-top shape is considered to be due to the following factors.

Factor 1 is considered to occur in the case where a base substance eluted in a liquid immersion fluid from the resist film is re-adsorbed on a resist surface, and, as a result, a photo-generated acid of an exposure area is shorted. In this case, the generation of the T-top shape in a resist pattern is reduced by means of an action of the acid contained into the liquid immersion medium fluid trapping the base substance eluted from the resist film.

Factor 2 is considered to occur in the case where a PAG (Photo Acid Generator) contained in the resist film is eluted into the liquid immersion medium fluid, and the photo-generated acid becomes insufficient due to a shortage of PAG at the exposure area of resist film. In this case, the generation of the T-top shape in the resist pattern is reduced by means of an action of the acid contained in the liquid immersion medium fluid compensating for the acid shorted at the exposure area of resist film.

Factor 3 is considered to occur in the case where the photo-generated acid at the exposure area contained in the resist film is eluted into the liquid immersion medium fluid, and the acid at the exposure area of the resist film becomes insufficient. In this case, like factor 2, the generation of the T-top shape in the resist pattern is reduced by an action of the acid contained into the liquid immersion medium fluid compensating for the acid shorted at the exposure area of resist film, and, in particular, an action of lowering an elution rate from the exposure area of resist film into the acid solution due to the presence of a substance of an approximately identical type.

Factor 4 is considered to occur in the case where the solution penetrated in the resist film dries, whereby the substance contained in the resist film is segregated on the resist film surface or the distribution of the substance contained in the resist film changes in the film thickness direction, and the hydrophoby of the resist film surface increases. In more detail, the difference of the surface property of resist film changes the quantity of the liquid immersion medium fluid adsorbed on or penetrated in the resist surface after exposure. Thus, the difference of the substrate temperature within wafer in a PEB process affects the pattern dimensions or a pattern shape. In addition, there occurs a difference in penetration rate of the developer in the development into the resist. In this case, increase of the acid concentration on the top surface of resist film, that promotes the deprotection reaction of the inhibition group and hydrophily of the resist surface, reduces the generation of the T-top shape of resist patterns.

Further, in the liquid immersion exposure tool that filled with the fluid in the optical path and its periphery, a difference occurs in contact history between the fluid and the resist film depending on the shot map and exposure sequence. As a result, with respect to factors 1 to 4 above, a difference occurs according to the contact history. Thus, it is considered that decrease of uniformity occurs in dimension and shape of the resist pattern within a wafer and/or within a shot. An acid is included in the solution, whereby the T-top shape is reduced, and at the same time, decrease of uniformity of the dimension and shape of the resist pattern is reduced.

Typical acids to be added in the fluid include a variety of acids such as a sulfuric acid, a nitric acid, a nitrous acid, an acetic acid, a hydrochloric acid, a hypochlorous acid, and organic sulfonic acids such as a perfluoro-alkylsulfonic acid and a cyclohexyl-sulfonic acid. A typical example of an acid generated by an optical reaction from the PAG for use in the chemically amplified resist is an organic-sulfonic acid. In more detail, it is believed that a type of a desired acid change due to a cause of a resist shape defect described in each of factors 1 to 4.

In factor 1, trapping a base substance is important. Thus, in general, as an acid to be added in the liquid immersion medium fluid, a weak acid having a low dissociation constant is desirable.

In factor 2 to factor 4, an acid to be added in the liquid immersion medium fluid is desirable to be as same as photo generated acid, that is generated in the exposure area of resist film. This is because the uniformity of the dimension and shape of the resist pattern is greatly improved since the acid added in the liquid immersion medium fluid contributes to the deprotection reaction of the resist in the PEB process and also the diffusion characteristic of the acid does not change. Alternatively, it is desirable to add in the liquid immersion medium fluid an acid having substantially the same reaction-limiting characteristic as the photo-generated acid, according as whether the deprotection reaction of the resist in the PEB process is a diffusion-limiting reaction or a supply-limiting reaction, to improve the uniformity of the shape and dimension of the resist pattern. As described previously, a typical example of the acid generated from the PAG by the optical reaction is an organic sulfonic acid. An example of a perfluoro alkyl sulfonic acid includes a trifluoro methyl sulfonic acid or nonafluoro butyl sulfonic acid.

In any of the above-described factors, a surface inhibition layer formed on the resist surface by the contact between the liquid immersion medium fluid and the resist film in the liquid immersion lithography process is restricted. Due to the reduction of the surface inhibition layer, defects after development of the resist film by poor dissolution may be reduced.

It is desirable to set the concentration of the acid added in the liquid immersion medium fluid to be as low as possible but to be enough to obtain the above-described advantageous effect relating to the resist pattern. This is because it makes no necessity of adjusting a projection optical system even when the refractive index of the liquid immersion medium fluid changes. This is further because it reduces corrosion of a portion of the exposure tool, which contacts with the liquid immersion medium fluid.

The present embodiment has described 157 nm immersion lithography. However, similar advantageous effect may be attained even if the exposure light of the light source has a different wavelength, as long as a liquid immersion medium fluid other than pure water is used.

Even when the cover material film is provided on the resist film, the similar advantageous effect can be attained if the shield of the cover material film is not perfect against the liquid immersion medium fluid, or if the resist film component dissolved by the solvent of the cover material is captured into the cover material film, or if particles are deposited onto the surface of the cover material film during coating and/or baking process.

In this case, the coating and baking process of a cover material solution are added between the resist film forming process and the pattern exposure process. Also, a removing process of the cover material film is added after the PEB process. The removing process of the cover material film includes a cover material film removing process using a dedicated removing solvent and a cover material film rinse process. Alternatively, the removing process of the cover material film includes a cover material film removing process and a resist developing process continuously carried out, by using a resist developer. In this case, a rinsing process may be added after the cover material film removing process.

Even when any type of a cover material film is used, when a cover material film is provided on the resist film, a word "resist film surface" is reread as a word "cover material film surface" in the present embodiment.

Second Embodiment

Now, a description will be given with respect to an embodiment in which liquid immersion lithography using a liquid immersion medium fluid other than pure water is used, and an acid is added in the liquid immersion medium fluid.

In the present embodiment, a cover material film is formed on a resist film.

A chemically amplified resist film is formed on a wafer in the same manner as that in the first embodiment. Further, a cover material solution is coated on the chemically amplified resist film. Heating is carried out for a predetermined period of time and at a predetermined temperature, as required, thereby forming a cover material film on the chemically amplified resist film. After forming the cover material film, liquid immersion lithography is carried out. A condition of the liquid immersion lithography is such that an exposure wavelength is 157 nm and an acid-added fluorine solution is used as a liquid immersion medium fluid.

After exposure, a PEB process is carried out to the substrate for a predetermined period of time and at a predetermined temperature. A predetermined removing solution of the cover material film is supplied onto the cover material film, thereby removing the cover material film. After the removing of the cover material film, a rinse process is carried out by using pure water. Developing is carried out for a predetermined period of time by using, typically, a 2.38% TMAH developer, thereby forming a resist pattern. After the developing of the resist pattern and a rinse process have been carried out, and then a drying process is carried out. These rinse processes are carried out by using pure water. However, a surfactant may be added to pure water, or a polar solvent or a supercritical gas may be used, instead.

The present embodiment has described a case in which a dedicated removing agent for the cover material film is used. However, by using a cover material film dissolvable by a resist developer, the cover material film removing and the resist developing may be continuously carried out. Alternatively, it is possible that a cover material film dissolvable by a developer is dissolved for a predetermined period of time by the developer, next, the developer and the dissolved substance of the cover material film are removed, thereafter, a rinse process is carried out as required, and then, the developer is supplied again.

By using the acid-added fluorine solution as the liquid immersion medium fluid, the T-top shaping of the resist pattern is reduced and the uniformity of the resist pattern dimension and shape within a wafer and/or within a shot is improved as compared with a case in which acid is not added. In addition, failure of removing the cover material film may be lowered.

When the cover material film is used, the factor regarding the above-described advantageous effect may be changed depending on a degree of the shield of the cover material film against the liquid immersion medium fluid and a degree of the shield of the cover material film against the elution of the substance contained in the resist film. These two shield characteristics are the basic characteristics of the cover material film.

If the two shield characteristics of the cover material film are insufficient, there exists a factor which is approximately the same as that in a case in which the cover material film is not used, although there is a difference in degree. Desirable acids are the same as those described in factors 1 to 3 in the first embodiment.

Factor 4 described in the first embodiment is of no importance in the present embodiment using a cover material film.

However, the dry state of the cover material film surface changes depending on the contact history between the cover material film and the liquid immersion medium fluid. As a result, it is considered that a difference in PEB temperature history occurs to exert an influence on the evenness of the pattern dimension and shape. To avoid this disadvantage, an acid is added in the liquid immersion medium fluid to make the surface property of the cover material film uniform, whereby uniformity of the pattern dimension and shape is improved.

On the other hand, if the above-described two shield by means of the cover material film are sufficiently excellent, it is considered that such excellence derives from the fact that the surface property of the cover material film varies due to a difference in contact history between the cover material film and the liquid immersion medium fluid, and in accordance with the difference of the surface property, a difference occurs in adsorption quantity of the liquid immersion medium fluid by the cover material film, thereby causing a difference in the PEB temperature history.

Even if a low molecule component does not exist in the cover material film, when the cover material solution is supplied onto the resist, the PAG segregated in the resist film, in particular, at an upper part of the film, is captured in the cover material film, and then segregated at the upper part of the cover material film. It is considered that a distribution of the substances deposited in the cover material film is changed by the difference of the contact history, whereby the resist surface property varies. On the other hand, it is also considered that an acid is supplied onto the cover material film surface, thereby making it possible to reduce the difference of the surface property.

It is desirable to set the concentration of the acid added in the liquid immersion medium fluid to be as low as possible but to be enough to obtain the above-described advantageous effect relating to the resist pattern. This is because it makes no necessity of adjusting a projection optical system even when the refractive index of the liquid immersion medium fluid changes. This is further because it reduces corrosion of a portion of the exposure tool, which contacts with the liquid immersion medium fluid.

In the present embodiment, 157 nm immersion lithography has been described. However, similar advantageous effect may be attained even if the exposure light of the light source has a different wavelength, as long as a liquid immersion medium fluid other than pure water is used.

Third Embodiment

In the first embodiment, there has been described a method of carrying out liquid immersion lithography by using a liquid immersion medium fluid obtained by adding an acid in a solvent other than pure water. In the present embodiment, there is described a method of carrying out liquid immersion lithography by using a liquid immersion medium fluid obtained by adding a surfactant in a solvent other than pure water. In the liquid immersion lithography according to the present embodiment, a cover material film is not used. The present embodiment is similar to the first embodiment except that liquid immersion lithography is carried out by using a liquid immersion medium fluid added with a surfactant. A detailed description of forming process through developing process of the resist film is therefore omitted.

By using the liquid immersion medium fluid added with a surfactant, an amount or size of bubbles generated in the liquid immersion medium fluid changes, and degradation of an optical image and transfer of a defect pattern can be reduced.

It is considered that the surface property of the resist film varies depending on a difference in contact history between the liquid immersion medium fluid and the resist film. In addition, the decrease of uniformity of the dimension and shape of the resist pattern within a wafer and/or within a shot occurs due to a change in temperature history of the PEB process caused by a change in quantity of the liquid immersion medium fluid adsorbed or penetrated by the resist film. It is considered that the surface property of the resist film is made uniform by means of the surfactant so that the decrease of uniformity of the dimension and shape is reduced.

In the method using the liquid immersion medium fluid to which a surfactant is added, it is considered that the surface of the resist film is made hydrophilic so that T-top shaping of the resist pattern and defects after development are reduced. T-top shaping of the resist pattern and defects after development are generated due to formation of a surface inhibition layer or hydrophoby of the resist film surface due to dry of the liquid immersion medium fluid. The surface inhibition layer is formed due to the shortage of the photo-generated acid or a PAG in the exposure portion of the resist film caused by the elution of the base or the PAG from the resist film into the liquid immersion medium fluid or due to the shortage of the deprotection reaction of the inhibition group of the resist film surface caused by the deposition of the base eluted into the liquid immersion medium fluid onto the resist film surface.

The present embodiment has described 157 nm immersion lithography. However, similar advantageous effect may be attained even if the exposure light of the light source has a different wavelength as long as a liquid immersion medium fluid other than pure water is used.

The embodiment has described a case in which a cover material film is not formed on the resist film. However, even when a cover material film is formed on the resist film, if the shield of the cover material film is not perfect against the liquid immersion medium fluid, a difference occurs in the surface property of the substrate within a wafer because of a component captured into the cover material film when the cover material solution is supplied. Therefore, even when a cover material film is used, an advantageous effect produced by replenishing an amount of an acid corresponding to that dissolved in the liquid immersion medium fluid is effective in improving uniformity of the surface property of the substrate within a wafer.

Fourth Embodiment

In the present embodiment, there is described an example of carrying out liquid immersion lithography by using a 193 nm immersion exposure tool.

An anti-reflection film is formed on a wafer, as required. A resist solution is coated on the anti-reflection film, and then baked (Pre Bake), to thereby form a chemically amplified resist film. A pattern formed on a predetermined photo mask is transferred onto the chemically amplified resist film formed on the substrate by using a liquid immersion exposure tool in which an optical path created between the final element of a projection optical system and a substrate when a light is emitted via at least an objective lens of the projection optical system onto the substrate is filled with a liquid immersion medium fluid.

In the present embodiment, a buffer solution obtained by adding salt to pure water is used as the liquid immersion medium fluid. The concentration of the salt is adjusted to an extent such that a change in optical constant does not substantially affect the resolution characteristic of the exposure tool. A PEB process, a developing process using 2.38% TMAH, and a rinse process using pure water are sequentially carried out to the chemically amplified resist film to which the pattern has been transferred. The buffer solution used here denotes a solution which is adjusted so that a change in hydrogen ion concentration occurring as a result of a chemical reaction is minimal.

When the buffer solution is used, uniformity of the shape of the resist pattern in positions within a wafer and/or within a shot improved as compared with a case in which pure water is used.

A method using the buffer solution as a liquid immersion medium fluid is considered to be effective in the cases in which the improvement of uniformity of the T-top shape in positions within a wafer and/or within a shot in the case where the liquid immersion medium fluid is pure water is derived from the following factors.

Factor I: In this case, a photo-generated acid eluted from the resist film into the liquid immersion medium fluid is adsorbed on the resist film surface, a difference in adsorption quantity of the photo-generated acid on the resist film surface occurs depending on positions within a wafer and/or within a shot, and the decrease of uniformity occurs with the resist film shape.

Factor II: In this case, the photo-generated acid eluted from the resist film is trapped by the base contained in the liquid immersion medium fluid, and the adsorption quantity is made uniform, so that the uniformity of the T-top shape in positions within a wafer and/or within a shot is improved.

Factor III: In this case, the PAG contained in the resist film is eluted into the liquid immersion medium fluid, a difference in adsorption quantity of the photo-generated acid generated in the liquid immersion medium fluid on the resist surface occurs depending on the position within a wafer and/or within a shot, and decrease of uniformity occurs with the resist film shape.

Factor IV: In this case, the photo-generated acid eluted from the resist film is trapped by the base contained in the liquid immersion medium fluid, and the adsorption quantity is made uniform, so that uniformity of the T-top shape in positions within a wafer and/or within a shot is improved.

Factor V: An amount of the photo-generated acid eluted from the resist film into the liquid immersion medium fluid changes depending on a pattern layout on the wafer, whereby an aberration quantity is changed by the pattern layout and the resist pattern dimensions and shape are changed by the influence of such a change. A change in refractive index of the liquid immersion medium fluid, occurring depending on the concentration of a substance dissolved by the change of pattern dimension and shape is reduced by a buffer action, and the change of resist pattern dimension and shape depending on the layout is reduced. However, it is considered that the influence is relatively small.

As a buffer solution, a salt of a weak acid or a middle acid and a weak base or a middle base is desirable. It is further desirable that the buffer solution is an acid composition. It is also desirable that a base anion or a base of a salt which is hardly deposited on the resist film surface be added.

Even when the cover material film is used on the resist film, the similar advantageous effect can be attained if the shield of the cover material film is not perfect against the liquid immersion medium fluid, or if the resist film component dissolved by the solvent of the cover material is captured into the cover material film, or if particles are deposited onto the cover material film during coating and/or baking process.

In this case, the coating and baking process of the cover material solution are added between the resist film forming process and the pattern exposure process. Also, a removing process of the cover material film is added after the PEB process. The removing process of the cover material film includes a cover material film removing process using a dedicated removing solvent and a cover material film rinse process. Alternatively, the removing process of the cover material film includes a cover material film removing process and a resist developing process continuously carried out, by using a resist developer. In this case, a rinsing process may be added after the cover material film removing process.

Even when any type of a cover material film is used, if a cover material film is provided on the resist film, a word "resist film surface" is reread as a word "cover material film surface" in the present embodiment.

Fifth Embodiment

In a fifth embodiment of the present invention, liquid immersion lithography is carried out by using liquid immersion medium fluid produced by adding an oxidative agent to pure water. Types of oxidative agents include hydrogen peroxide water, ozone, hypochlorous acid, oxygen and the like. It is preferable that the concentration of the oxidative agent is within a range in which a change in optical constant from pure water does not substantially affect the resolution of the exposure tool. The present embodiment is similar to the third embodiment except that a different liquid immersion medium fluid is used. A detailed description of forming a resist pattern is therefore omitted here.

By using the liquid immersion medium fluid to which the oxidative agent is added, there can be expected reduction of the T-top shaping of the obtained resist pattern, reduction of the edge roughness, and/or reduction of the pattern dimensional change depending on the peripheral pattern density. Further, it is considered that since the liquid immersion medium fluid added with oxidative agent has a removing effect of a surface inhibition layer from the resist film surface and a hydrophilic effect to the resist film surface, there can be attained advantageous effect of reducing the T-top shaping, reducing an edge roughness derived from the reduction, and reducing defects after development and the like.

Even when the cover material film is provided on the resist film, the similar advantageous effect can be attained if the shield of the cover material film is not perfect against the liquid immersion medium fluid, or if the resist film component dissolved by the solvent of the cover material is captured into the cover material film, or if particles are deposited on the surface of the cover material film during coating and/or baking process.

In this case, the coating and baking process of the cover material solution are added between the resist film forming process and the pattern exposure process. Also, a removing process of the cover material film is added after the PEB process. The removing process of the cover material film includes a cover material film removing process using a dedicated removing solvent and a cover material film rinse process. Alternatively, the removing process of the cover material film includes a cover material film removing process and a resist developing process continuously carried out, by using a resist developer. In this case, a rinsing process may be added after the cover material film removing process.

Even when any type of a cover material film is used, if a cover material film is provided on the resist film, a word "resist film surface" is reread as a word "cover material film surface" in the present embodiment.

Sixth Embodiment

By using a liquid immersion medium fluid to which an oxidative agent and a surfactant are added, similar advantageous effect to that obtained in the case where only the oxidative agent or only the surfactant is added can be attained.

In the present embodiment, as in the second embodiment, 157 nm immersion lithography is carried out, in which a cover material film is provided on a chemically amplified resist film. Processes other than liquid immersion lithography process are similar to those of the second embodiment, and thus, a duplicate description is therefore omitted here.

When the concentration of the added oxidative agent is high, bubbles are generated during exposure and may cause a flare or an abnormal pattern transfer. Thus, even when the hydrophily of the resist film surface is to be improved by adding the oxidative agent, an upper limit of the oxidative agent to be added exists. Thus, by using a proper surfactant according to the oxidative agent or the substance film material, the generation of bubbles is restricted, thereby attaining a higher hydrophily. As a result, uniformity of the dimension and shape of the resist pattern is improved. Also, generation of the surface inhibition layer is restricted, thereby reducing defects after development.

The oxidative agents may include hydrogen peroxide, a hypochlorous acid and the like other than ozone described above.

In a liquid immersion exposure tool which uses, as the liquid immersion medium fluid, a pure solvent instead of pure water, further advantageous effect can be attained. The absorption coefficients of 157 nm wavelength of the following three solvents considered as liquid immersion medium fluids for 157 nm wavelength are 6 $cm^{-1}$ in PFPE (prefluorinated polyethers); 0.64 $cm^{-1}$ in PFTG (perfluoro triglyime: $CF_3[OCF_2CF_2]_3OCF_3$); and 0.2 $cm^{-1}$ in IF24 (available from DuPont) (M. Switkes et al., J. Vac. Sci. Technol. B21 (6), pp. 2794-2799 (2003)). When the transparency of these liquid immersion medium fluids is low, there occurs decomposition of the liquid immersion medium fluids caused by an exposure light. As a result, a gas is generated in the liquid immersion medium fluid. Thus, if a gas or an oxidative agent which generates a gas is added in the liquid immersion medium fluid, there is a high possibility to generate bubbles. However, it is possible to restrict the generation of bubbles by adding a proper surfactant.

In the present embodiment, a cover material film is formed on a resist film. However, the similar advantageous effect can be attained in the case where a cover material film is not formed. The present embodiment is not limited to the presence or absence of the cover material film.

Seventh Embodiment

In the present embodiment, as in the second embodiment, 157 nm immersion lithography is carried out, in which a cover material film is formed on a chemically amplified resist film. Processes other than liquid immersion lithography process are similar to those of the second embodiment, and thus, a duplicate description is omitted here.

In the present embodiment, use is made of a liquid immersion medium fluid in which acid and a surfactant are added to a solvent other than pure water. Desirable acids are similar to those described in the first embodiment. By using the liquid immersion medium fluid added with the acid and the surfactant, there can be obtained the advantageous effect achieved in a case in which only the acid is added. Also, there can be obtained the advantageous effect achieved in a case in which only the surfactant is added.

Further, the following additional effects can be attained. Depending on the type of acid, bubbles are generated during exposure in the case where the concentration of the acid is high, which may cause a flare or an abnormal pattern transfer. Accordingly, in achieving advantageous effect of eliminating the influence of shortage of the acid contained in the resist film or elution of a base by adding the acid, the obtained advantageous effect is limited in view of an upper limit of the adding quantity of the acid. However, by using a proper surfactant according to the acid to be added and the type of the film, it becomes possible to restrict the generation of bubbles, improve uniformity of the resist pattern dimension and shape, and reduce defects after development.

In addition, in a liquid immersion exposure tool which uses, as the liquid immersion medium fluid, a pure solvent instead of pure water, further advantageous effect can be attained. The light absorption coefficients of 157 nm wavelength of the following three solvents considered as liquid immersion medium fluids for 157 nm wavelength are 6 $cm^{-1}$ in PFPE (prefluorinated polyethers); 0.64 $cm^{-1}$ in PFTG (perfluoro triglyime: $CF_3[OCF_2CF_2]_3OCF_3$); and 0.2 $cm^{-1}$ in IF24 (available from DuPont) (M. Switkes et al., J. Vac. Sci. Technol. B21 (6), pp. 2794-2799 (2003)). When the transparency of these liquid immersion medium fluids is low, there occurs decomposition of the liquid immersion medium fluids caused by an exposure light. As a result, a gas is generated in the liquid immersion medium fluid. Thus, if a gas or an oxidative agent which generates a gas is added in the liquid immersion medium fluid, there is a high possibility to generate bubbles. However, it is possible to restrict the generation of bubbles by adding a proper surfactant.

Further, while the embodiment has presented a case where a cover material film is formed on a resist film, the similar advantageous effect can be attained in the case where a cover material film is not formed. With the present embodiment, the advantageous effects described in the second and third embodiments are further attained.

Eighth Embodiment

An anti-reflection film is formed on a semiconductor substrate, as required. A resist solution is coated on the anti-reflection film, and then baked (Pre Bake), to thereby form a resist film. By using a liquid immersion exposure tool in which an optical path created between the final element of a projection optical system and a substrate when a light is emitted via at least an objective lens of the projection optical system onto the substrate is filled with the above-described liquid immersion medium fluid, pattern exposure is carried out by using a predetermined photo mask against the resist film on the substrate. A cleaning process is carried out by using an acid solution to the substrate on which a pattern has been transferred. A rinse process may be carried out after the cleaning process, as required. Next, a PEB process, a developing process using 2.38% TMAH, and a rinse process using pure water are carried out.

After the cleaning process, it is preferable that the substrate is scanned by an air knife for dry. The air knife blows an acid or alkali filtered gas onto the substrate. It is also desired that a direction of the air blown from the air knife is a moving direction of the air knife so that air blow direction and the knife moving direction are the same direction. By setting the directions to be the same direction, water can be efficiently removed for a short period of time. The importance of removing the cleaning solution in this process is that no drying is carried out under a heat treatment or pressure reduction. If drying is carried out under a heat treatment or pressure reduction, an acid generating material and an acid trapping material are extracted from the resist film, these materials appear again on the resist film surface, and the advantageous effect of cleaning is not obtained. If the substrate has a small diameter, drying may be carried out by rotating the substrate without using an air knife. An air gun may be used instead of the air knife. However, the residual water is more removed by using the air knife than using the air gun.

When a cleaning process is not carried out between the exposure process and the PEB process, there occurs a phenomenon such as the generation of the T-top shape of the resist pattern and/or the lowering of edge roughness, or insufficient pattern dimension within a wafer and/or within a shot.

When an acid solution is used as the cleaning solution, an acid is replenished to an upper part of the resist film. As a result, in almost all of the resist processes, the T-top shaping, the edge roughness, and the peripheral pattern density dependency of pattern dimension are reduced. It is considered that the advantageous effect of reduction of the T-top shaping is achieved due to one of the following factors.

Factor A: A PAG contained in the resist film is eluted into the liquid immersion medium fluid and/or in the cleaning solution, and the photo-generated acid is insufficient due to the shortage of the PAG contained in the exposure area of the resist film. In this case, the acid contained in the cleaning solution compensates for the shortage of the acid in the resist film exposure area to thereby reduce the T-top shaping.

Factor B: The acid of the exposure area is deactivated due to re-depositing of the base eluted into the cleaning solution on the resist film. In this case, the acid contained in the cleaning solution compensates for the shortage of the acid in the resist exposure area to thereby reduce the T-top shaping.

Factor C: The liquid immersion medium fluid penetrated in the resist film dries. As result, the substance contained in the resist film is segregated on the resist film surface or changes in distribution thereof in the film thickness direction, so that the hydrophoby of the surface of the resist film increases. In more detail, the liquid immersion medium fluid quantity adsorbed on or penetrated into the resist surface after exposure changes due to decrease of uniformity of the surface property of the resist film. Thus, a substrate temperature in a developing process changes within a wafer, and such a change affects the pattern dimension and shape. Further, a difference occurs in penetration rate of the developer into the resist film in the developing process. In this case, the deprotection reaction of the inhibition group is accelerated by increasing the acid concentration on the resist film, so that the T-top shaping is reduced by hydrophilic effect.

Ninth Embodiment

In the present embodiment, a cleaning solution added with an oxidative agent is used in a cleaning process after an exposure process. A rinse process may be carried out after the cleaning process, as required. Other processes are similar to those of the eighth embodiment, and thus, a duplicate description is omitted here.

It is considered that, since a cleaning solution added with an oxidative agent is used, an upper part of a resist film is oxidized and the hydrophily is improved. As a result, in almost all of the resist processes, the T-top shaping, the edge roughness, and the peripheral pattern density dependency of pattern dimensions are reduced.

For oxidizing the resist film surface, it is possible that the process of supplying cleaning solution onto the substrate is replaced with a process of exposing the substrate surface to mist or steam.

Tenth Embodiment

In the present embodiment, a cleaning solution added with a surfactant is used in a cleaning process after an exposure process. A rinse process may be carried out after the cleaning process, as required. Other processes are similar to those of the eighth embodiment, and thus, a duplicate description is omitted here.

For the above-described factors, it is considered that wettability or hydrophily of the resist film to a developer is improved, since a cleaning solution added with a surfactant is used. As a result, in almost all of the resist processes, the T-top shaping, the edge roughness, and the peripheral pattern density dependency of pattern dimensions are reduced.

For contacting a surfactant on the resist film surface, it is possible that the process of supplying cleaning solution onto the substrate is replaced with a process of exposing the substrate surface to mist or steam.

Eleventh Embodiment

An anti-reflection film is formed on a substrate, as required. A resist solution is coated on the anti-reflection film, and then baked (Pre Bake), to thereby form a resist film. By using a liquid immersion exposure tool in which an optical path created between the final element of a projection optical system and a substrate when a light is emitted via at least an objective lens of the projection optical system onto the substrate is filled with a liquid immersion medium fluid, pattern exposure is carried out by using a predetermined photo mask against the resist film on the substrate. The liquid immersion medium fluid contains pure water added with a predetermined substance at a low concentration at which an optical constant of pure water does not substantially affect the resolution of the exposure tool. A cleaning process using a cleaning solution is carried out to the substrate on which a pattern has been transferred. A rinse process may be carried out after the cleaning process, as desired. After the cleaning process or the rinse process, a PEB process, a developing process using 2.38% TMAH, and a rinse process using pure water are carried out.

An acid, a salt serving as a buffer solution, an oxidative agent, a surfactant and the like are desirable as the substance added in the liquid immersion medium fluid. Advantageous effect attained by these substances is the same as those described in the first to fourth embodiments.

As a result, it is possible to improve of uniformity of the dimension and shape of the resist pattern within a wafer in addition to reducing the T-top shaping and the decrease of uniformity of the dimension and shape of the resist pattern within each of shots.

As shown in the first to fourth embodiments, it is considered that the T-top shaping of the resist pattern and the decrease of uniformity of the resist pattern shape in the shot can be reduced by the exposure using the liquid immersion medium fluid added with a predetermined substance at a predetermined concentration. However, there is a possibility that a change of the resist pattern shape having a further different distribution occurs within a wafer depending on the presence time, scan rate, flow rate and the like, of the liquid immersion medium fluid on the resist film. This is because, depending on difference of the presence time, scan rate, flow rate and the like, of the liquid immersion medium fluid on the resist film, a distribution occurs in the adsorption quantity on the resist surface, of the a predetermined additive contained in the liquid immersion medium fluid or the substance eluted from the resist film, according to the exposure sequence within a wafer or exposure area. As discussed in the embodiments, by adding the cleaning process after liquid immersion lithography, the distribution of the additive or eluted substance according to the position within a wafer or exposure sequence is eliminated or reduced.

In the cleaning process, the resist film is immersed in the cleaning solution, composition of the resist film is eluted from the resist film, and the resist film is dried. Due to these facts, the composition or the surface property of the resist film varies in the cleaning process. These changes occur due to the liquid immersion lithography, and need to be suppressed. To this end, it is desirable that the cleaning process after liquid immersion lithography is carried out at a relatively short period of time and under a low pressure in consideration of a contact time of the liquid immersion medium fluid in the liquid immersion lithography and a relative flow rate and a relative pressure of the liquid immersion medium fluid against the wafer.

Twelfth Embodiment

In the method described in the eleventh embodiment, an acid solution is used as an additive to the cleaning solution used in the cleaning process carried out after liquid immersion lithography. As a result, in addition to the advantageous effect of the eleventh embodiment, further advantageous effect can be obtained, that is, a condition of the cleaning time, the cleaning pressure and the like can be easily determined.

Since an acid is supplied from an acid cleaning solution to an upper part of the resist film, it is possible to compensate for the shortage of the acid caused by the elution into the cleaning solution, of the photo-generated acid contained in the resist due to the cleaning. Although there makes the resist film surface hydrophobic due to penetrating and drying of the cleaning solution, since an acid is deposited onto the resist film surface to thereby increase the deprotection reaction of the inhibition group so that hydrophily of the resist surface can be increased.

Thirteenth Embodiment

In the method described in the eleventh embodiment, an oxidative agent is used as an additive to the cleaning solution used in the cleaning process carried out after liquid immersion lithography. As a result, in addition to the advantageous effect of the eleventh embodiment, further advantageous effect can be obtained, that is, a condition of the cleaning time, the cleaning pressure and the like can be easily determined.

Since a surface inhibition layer at an upper part of the resist film caused by liquid immersion lithography and cleaning is removed by means of the oxidation function, uniformity of the dimension and shape of the resist is improved within a shot, between shots, and within a wafer. The improvement effect is high as compared with a case of carrying out cleaning with pure water, thus making it easy to determine a condition of the cleaning time, the cleaning pressure, and the like.

Fourteenth Embodiment

In the method described in the eleventh embodiment, a cleaning solution including a surfactant is used for the cleaning process carried out after liquid immersion lithography. As a result, in addition to the advantageous effect of the eleventh embodiment, further advantageous effect can be obtained, that is, a condition of the cleaning time, the cleaning pressure and the like can be easily determined.

A surface inhibition layer of an upper part of the resist caused by liquid immersion lithography and cleaning is made hydrophilic by means of a surfactant. Thus, the affinity with a developer in the subsequent developing process can be enhanced, making it possible to improve uniformity of the dimension and shape of the resist. The reduction effect is high as compared with a case of carrying out cleaning with pure water and a condition of the cleaning time, the pressure and the like can be easily determined.

For contacting a surfactant on the resist film surface, it is possible that the process of supplying a liquid onto the substrate is replaced with a process of exposing the substrate surface to mist or steam.

Fifteenth Embodiment

In the present embodiment, there is described a pattern forming method including a process of cleaning a cover material film by using a predetermined solution before exposure, in liquid immersion lithography process of forming the cover material film on a resist film.

A single or multi-layered anti-reflection film is formed on a substrate, as required. A resist solution is coated on the substrate and the anti-reflection film, and baking is carried out at a predetermined temperature and for a predetermined period of time to form a resist film.

A cover material solution is coated on the resist film, and baking is carried out at a required predetermined temperature and for a predetermined required period of time according to type of the cover material solution, to form a cover material film on the resist film. After a solvent including a predetermined substance at a predetermined concentration has been supplied onto the cover material film, a cleaning process of removing the solvent is carried out. A detailed description of the cleaning process will be given later.

A pattern on a photo mask is transferred onto the substrate by using liquid immersion lithography in which an optical path created between the final element of a projection optical system and the cover material film formed on the resist film when a light is emitted via at least an objective lens of the projection optical system onto the substrate is filled with a liquid immersion medium fluid.

After the exposure has been carried out, baking (PEB) is carried out, and then the cover material film has been removed. After that, a developing process and a rinse process of the resist film are carried out.

The cleaning process carried out prior to the exposure process will be described here.

In an example of a typical cleaning process, a cleaning is carried out by supplying a cleaning solution to the center of the substrate or symmetrical portions near the center of the substrate for a predetermined of time, while the substrate is rotated. Thereafter, the substrate is rotated at a high speed to thereby dry the substrate (spin drying).

Pure water is generally used as a cleaning solution used in the cleaning process. However, in achieving the advantageous effect intended by the present embodiment, it is desirable to add a predetermined substance if an essential component of the liquid immersion medium fluid is pure water. The desired additives include an oxidative agent, hydrogen, carbon dioxide, a surfactant, and an alcohol.

When the liquid immersion medium fluid is a pure solution other than water, it is desirable to carry out the cleaning by using the purer solution. When the liquid immersion medium fluid is a mixture solution of a predetermined rate of a plurality of pure solutions, it is desirable to carry out the cleaning by using one of the components of the mixture solution. Further advantageous effect can be attained by adding an oxidative agent, hydrogen, carbon dioxide, a surfactant, and an alcohol.

By using the method according to the present embodiment, a change of the three-dimensional shape of the resist pattern including dimensions within a wafer and/or within a shot is reduced.

A description will be given below with regard to the reason why the described advantageous effect is obtained. Also, a description will be given below with regard to desirable cleaning solution and additives.

A cover material film is formed through a process of coating and baking a cover material solution. Thus, if the cover material film is made of a plurality of solid components, there exists a change in distribution of the components in the film thickness direction. If a low molecule component, in particular, a low molecule component with polarities, exists in the cover material solution, there occurs segregation of the low molecule component near a surface of the cover material film. If the low molecule component is soluble to the liquid immersion medium fluid and if a difference exists in history of contact with the liquid immersion medium fluid in the liquid immersion lithography process, a difference occurs in distribution of the low molecule components within a substrate or between shots. As a result, a difference occurs in the surface property of the cover material film, and thus a difference occurs with an amount of the liquid immersion medium fluid adsorbed on the cover material film. In the PEB process, since an evaporated heat is absorbed when the liquid immersion medium fluid evaporates, a change occurs in temperature history of the resist film within a substrate and/or between shots. As a result, there occurs a change of the resist pattern shape within the substrate and/or between shots. In addition, in an extreme case, the difference of the surface property causes the liquid immersion medium fluid to remain on the resist film. As a result, the liquid immersion medium fluid may be dripped in the exposure tool and/or the coating/developing device in the period from a wafer stage of the exposure tool to the PEB process, in addition to the change of resist pattern shape due to the change of the temperature history in the PEB process. The dripped liquid immersion medium fluid contaminates the exposure tool and the coating/developing device, and may cause a failure of an electrical control system.

The low molecule components include a surfactant for improving the coating property of a cover material solution, and an acid to be added to compensate for the shortage of a photo-generated acid contained in the resist film, the shortage being caused by diffusion of the photo-generated acid from the resist film into the cover material film. Even when a low molecule component does not exist in the cover material film, in some cases, a PAG and the like segregated at the upper part of the resist film is dissolved in the cover material film by means of a solvent of the cover material solution, and then, there occurs a phenomenon which is similar to a case in which a low molecule component exists in the cover material solution. Moreover, depending on type of the solvent of the cover material solution, similar influence may occur due to the distribution of the remained solvent.

The low molecule component segregated at the upper part of the cover material film, in particular, a polar component, is removed in accordance with the cleaning process, whereby a change of the three-dimensional shape of the resist pattern including dimensions within a wafer and/or within a shot is reduced.

When the cleaning solution is pure water and a segregation of the component of the upper part of the cover material film causes a problem, it is desirable to add a solution in pure water as the cleaning solution and the liquid immersion medium fluid (an essential component if the liquid immersion medium fluid is a mixture solution). The solution to be added has a boiling point lower than a cleaning solution and does not solve the cover material film resin. Desirable additives include alcohol and ester, in particular, a low class alcohol and a low class ester. The reason why the alcohol and ester are desirable is that the cleaning solution can possibly be quickly dried because of its small heat of vaporization.

An adsorption quantity or immersion quantity of the liquid immersion medium fluid onto or into the cover material film changes due to an influence of a substance deposited or adsorbed on a top surface of the cover material film in the coating and/or baking process in the cover material film forming process. As a result, uniformity of the resist pattern dimension and shape decreases due to a change of the temperature history in the PEB process. Moreover, removal failure of the cover material film may occur due to these adsorbed substances.

Cleaning solutions used to remove the substances deposited and adsorbed on the cover material film include pure water, a liquid immersion medium fluid (an essential component if the liquid immersion medium fluid is a mixture solution), alcohol, a surfactant, hydrogen, carbon, and an oxidative agent such as ozone and hydrogen peroxide. The deposited and adsorbed substances is easily removed from the cover material film surface by a surface activation effect of alcohol or a surfactant, or alternatively, by a proper electric potential adjusting function of hydrogen, carbon, or ozone. Regarding hydrogen, carbon, or ozone, it is desirable to select a proper substance according to an electric potential of the deposited and adsorbed substances in the cleaning solution.

The substances having an oxidization function such as ozone or hydrogen peroxide oxidize and decompose the substances deposited on the cover material film surface and also oxidize the cover material film surface to thereby adjust the wettability and affinity to a liquid immersion medium fluid, so that involvement of an atmospheric gas at an interface of the supply area of the liquid immersion medium fluid is restricted.

In the cleaning process and drying process carried out prior to the exposure process, it is desirable that drying quickly is ended and that a cleaning time and a drying rate be uniform within a wafer. If the drying time is long, a new segregated layer is formed in a resist film or a cover material film by a chromatograph. If the cleaning time and drying time are non-uniform within a wafer, a new distribution is produced in the film thickness direction distribution of a low molecule component of the resist film or cover material film.

A mechanism for supplying and drying a cleaning solution will be described here. For example, a cleaning solution is supplied onto the substrate from a cleaning solution supply nozzle for ejecting the cleaning solution via a slit-shaped opening which is longer than the substrate. The distribution of the supply quantities of the cleaning solution in the longitudinal direction of the slit is made uniform. The cleaning solution supply nozzle carries out scanning on the substrate in a direction perpendicular to the slit longitudinal direction, while the cleaning solution is being supplied. In addition, an air knife carries out scanning on the substrate to dry the cleaning solution. In order to make the contact time of the cleaning solution uniform, it is preferable that a distance between the cleaning solution nozzle and the air knife is adjusted to be constant. Further, a rinse solution supply nozzle may be provided between the cleaning solution supply nozzle and the air knife. In this case also, in order to make the contact time of the cleaning solution uniform, it is preferable that a distance between the cleaning solution nozzle and the air knife is adjusted to be constant.

In forming the resist film and the anti-reflection film, there contains generally an removing process in which a predetermined region of the peripheral portion of the substrate is generally removed in the film forming process in view of an occurrence of dust in a transportation casing, an occurrence of dust in a machining process, contamination of the equipment due to an organic substance, or machining uniformity. In a process of forming a coat film, a solvent for the coat film is supplied to the peripheral portion of the substrate, thereby removing the coat film of the substrate peripheral portion. It is necessary that the cover material film is formed so as to fully coat the resist film in which a stepped portion is exposed on at least the substrate or the anti-reflection film. It is also desirable that the cover material film is formed so as to fully coat the anti-reflection film and a lower layered film from which a substance may be eluted into the liquid immersion medium fluid.

There is a promising system in which a liquid immersion medium fluid is supplied and removed in only a predetermined area of the exposure field periphery in an exposure tool of a conventional scan and repeat system, instead of fully immersing the substrate in the liquid immersion medium fluid. However, the primary advantageous effect of the present embodiment, of the reduction of the decrease of uniformity of pattern dimension and shape, is not limited by the supply area of the liquid immersion medium fluid or method of moving an exposure field (such as a step and repeat system).

Further, it is possible that the lithography technology described in the embodiments is applied to methods of manufacturing various devices, for example, a method of manufacturing a semiconductor device, a method of manufacturing a magnetic device, and other methods of manufacturing devices including forming pattern by using lithography technology.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A device manufacturing method comprising:
   forming a resist film on a substrate;
   preparing an exposure tool which comprises a projection optical system;
   preparing a photo mask on which a mask pattern is formed;
   mounting the substrate and the photo mask on the exposure tool, the substrate having the resist film formed thereon;
   transferring the mask pattern formed on the photo mask onto the resist film in a state in which a solution including an oxidative agent is filled between the resist film and a final element of the projection optical system to form a latent image of the mask pattern on the resist film;
   heating the resist film having the latent image formed thereon; and
   developing the heated resist film.

2. A device manufacturing method according to claim 1, wherein a concentration of the oxidative agent is a concentration at which a surface of the resist film is oxidized.

3. A device manufacturing method comprising:
   forming a resist film on a substrate;
   forming a cover material film on the resist film;
   preparing an exposure tool which comprises a projection optical system;
   preparing a photo mask on which a mask pattern is formed;
   mounting the substrate and the photo mask on the exposure tool, the substrate having the resist film formed thereon;
   transferring the mask pattern formed on the photo mask onto the resist film in a state in which a buffer solution is filled between the cover material film and a final element of the projection optical system to form a latent image of the mask pattern on the resist film;
   heating the resist film having the latent image formed thereon;
   removing the resist film after the heating of the resist film; and
   developing the heated resist film.

4. A device manufacturing method comprising:
   forming a resist film on a substrate;
   preparing an exposure tool which comprises a projection optical system;
   preparing a photo mask on which a mask pattern is formed;
   mounting the substrate and the photo mask on the exposure tool, the substrate having the resist film formed thereon;
   transferring the mask pattern formed on the photo mask onto the resist film in a state in which a solution including a surfactant and an acid or a solution including a surfactant and an oxidative agent is filled between the resist film and a final element of the projection optical system to form a latent image of the mask pattern on the resist film;
   heating the resist film having the latent image formed thereon; and
   developing the heated resist film.

5. A device manufacturing method comprising:
   forming a resist film on a substrate;
   forming a cover material film on the resist film;
   preparing an exposure tool which comprises a projection optical system;
   preparing a photo mask on which a mask pattern has been formed;
   mounting the substrate and the photo mask on the exposure tool, the substrate having the resist film formed thereon;
   transferring the mask pattern formed on the photo mask onto the resist film in a state in which a solution including a solvent other than pure water and a predetermined additive is filled between the cover material film and a final element of the projection optical system to form a latent image of the mask pattern on the resist film;
   heating the resist film having the latent image formed thereon;
   removing the cover material film after the heating of the resist film; and
   developing the heated resist film.

6. A device manufacturing method according to claim 5, wherein the solution includes any of an acid, an oxidative agent and a surfactant.

7. A device manufacturing method comprising:
forming a resist film on a substrate;
preparing an exposure tool which comprises a projection optical system;
preparing a photo mask on which a mask pattern is formed;
mounting the substrate and the photo mask on the exposure tool, the substrate having the resist film formed thereon;
transferring the mask pattern formed on the photo mask onto the resist film in a state in which a solution including a solvent other than pure water and a predetermined additive is filled between the resist film and a final element of the projection optical system to form a latent image of the mask pattern on the resist film;
cleaning a surface of the resist film having the latent image formed thereon by using a cleaning solution;
heating the resist film; and
developing the heated resist film.

8. A device manufacturing method according to claim 7, wherein the additive is one or more substances selected from the group including an acid, a salt for making the solution into a buffer solution, an oxidative agent and a surfactant.

9. A device manufacturing method according to claim 7, wherein the cleaning solution includes any of an acid, an oxidative agent and a surfactant.

10. A device manufacturing method comprising:
forming a resist film on a substrate;
forming a cover material film on the resist film;
preparing an exposure tool which comprises a projection optical system;
preparing a photo mask on which a mask pattern is formed;
mounting on the exposure tool the substrate and the photo mask, the substrate having the resist film formed thereon;
transferring the mask pattern formed on the photo mask onto the resist film in a state in which a solution including a solvent other than pure water and a predetermined additive is filled between the cover material film and a final element of the projection optical system to form a latent image of the mask pattern on the resist film;
cleaning a surface of the cover material film on the resist film having the latent image formed therein by using a cleaning solution;
heating the resist film;
removing the cover material film after the heating of the resist film; and
developing the heated resist film.

11. A device manufacturing method according to claim 10, wherein the additive is one or more substances selected from the group including an acid, a salt for using the solution as a buffer solution, an oxidative agent and a surfactant.

12. A device manufacturing method according to claim 10, wherein the cleaning solution includes any of an acid, an oxidative agent and a surfactant.

13. A device manufacturing method comprising:
forming a resist film on a substrate;
forming a cover material film on the resist film;
cleaning a surface of the cover material film by using a cleaning solution;
preparing an exposure tool which comprises a protection optical system;
preparing a photo mask on which a mask pattern has been formed;
mounting on the exposure tool the substrate and the photo mask, the substrate having the resist film formed thereon;
transferring the mask pattern formed on the photo mask onto the resist film in a state in which a solution is filled between the cover material film and a final element of the projection optical system to form a latent image of the mask pattern on the resist film;
heating the resist film having the latent image formed thereon;
removing the cover material film after the heating of the resist film;
developing the heated resist film.

14. A device manufacturing method according to claim 13, wherein the cleaning solution includes any of an alcohol, ether, a surfactant, an oxidative agent, hydrogen and carbon dioxide.

* * * * *